(12) United States Patent
Kondo et al.

(10) Patent No.: US 9,921,465 B2
(45) Date of Patent: Mar. 20, 2018

(54) REFLECTIVE MASK, REFLECTIVE MASK BLANK AND MANUFACTURING METHOD THEREFOR

(71) Applicant: Toppan Printing Co., Ltd., Tokyo (JP)

(72) Inventors: Shinpei Kondo, Tokyo (JP); Norihito Fukugami, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 66 days.

(21) Appl. No.: 15/072,164

(22) Filed: Mar. 16, 2016

(65) Prior Publication Data

US 2017/0269468 A1 Sep. 21, 2017

(51) Int. Cl.
   *G03F 1/22* (2012.01)
   *G03F 1/24* (2012.01)

(52) U.S. Cl.
   CPC ..................................... *G03F 1/24* (2013.01)

(58) Field of Classification Search
   None
   See application file for complete search history.

(56) References Cited

U.S. PATENT DOCUMENTS

2012/0237860 A1  9/2012  Kim et al.

FOREIGN PATENT DOCUMENTS

| JP | 2006-011121 A | 1/2006 |
| JP | 2006-038928 A | 2/2006 |
| JP | 2009-212220 A | 9/2009 |
| JP | 2011-073935 A | 4/2011 |

OTHER PUBLICATIONS

Office Action dated Apr. 14, 2017 issued in Japanese Patent Application No. 2013-179498.

*Primary Examiner* — Stephen Rosasco
(74) *Attorney, Agent, or Firm* — Foley & Lardner LLP

(57) ABSTRACT

A reflective mask reducing reflection of out-of-band light. The reflective mask includes a light shielding frame formed in a mask region corresponding to a boundary region of a chip on a semiconductor substrate multiply exposed. The substrate of the light shielding frame includes a layer having a different refractive index or includes pores to change the path of incident out-of-band light to thereby suppress the out-of-band light from being reflected off the conductive film. The substrate also includes a layer having a different refractive index relative to out-of-band light reflected off the conductive layer. With the reflective mask of this configuration, influence on the wiring pattern dimension can be reduced and productivity of the semiconductors can be improved.

10 Claims, 11 Drawing Sheets

211

211

29

221

REFLECTIVE MASK, REFLECTIVE MASK BLANK AND MANUFACTURING METHOD THEREFOR

TECHNICAL FIELD

The present disclosure relates to a reflective mask and a reflective mask blank, and more particularly to a reflective mask, a reflective mask blank, and a manufacturing method therefor for use in a semiconductor fabrication apparatus, for example, that uses EUV (extreme ultraviolet) lithography in which an EUV source is used as a light source.

BACKGROUND (EUV Lithography)

There is a trend in recent years to provide finer structures on semiconductor devices. With this trend, there has been proposed EUV lithography in which EUV having a wavelength of approximately 13.5 nm is used as a light source. EUV lithography, in which the light-source wavelength is short and light absorbency is very high, has to be conducted in a vacuum. In the wavelength range of EUV, most substances have a refractive index slightly smaller than 1. Therefore, EUV lithography cannot use transmission-type refractive optical systems that have been conventionally used, but has to use reflective optical systems. Therefore, in EUV lithography, conventional transmission-type masks cannot be used as a photomask (hereinafter referred to as the "mask") that is an original plate, but reflective-type masks have to be used.

(Structures of EUV Mask and Blank)

A reflective mask blank, which is an original mask of such a reflective-type mask, includes a multi-layer reflective layer and an absorbing layer formed in this order on a low thermal expansion substrate. The multi-layer reflective layer has a high reflectance relative to the wavelength of an exposure light source. The absorbing layer absorbs the wavelength of the exposure light source. The substrate has a rear face on which a rear-face conductive film is formed for an electrostatic chuck in an exposure device. There is also an EUV mask having a structure in which a buffer layer is provided between a multi-layer reflective layer and an absorbing layer. In processing a reflective mask blank into a reflective mask, the absorbing layer is partially removed by electron beam (EB) lithography and etching. In the case of the structure having a buffer layer, the absorbing layer is similarly removed to form a circuit pattern composed of absorbing portions and reflecting portions. An optical image reflected by the reflective mask thus prepared is transferred onto a semiconductor substrate by way of a reflective optical system.

(Thickness of Absorbing Layer of EUV Mask and Reflectance)

In exposure methods using a reflective optical system, light is applied to a mask surface at an incident angle which is inclined by a predetermined angle (usually 6°) relative to a vertical direction. Accordingly, in the case where the thickness of the absorbing layer is large, the incident light casts a shadow of the pattern on the semiconductor substrate. Since the shadowed portions will have reflection intensity smaller than in the unshadowed portions, contrast is lowered in the transferred pattern, causing blurred edges or displacement from designed dimensions. This is called shadowing, which is one of the problems inherent to reflective masks.

In order to prevent blur in the pattern edges or displacement from designed dimensions, an effective way is to reduce the thickness of the absorbing layer and the height of the pattern. However, a reduced thickness of the absorbing layer degrades the light shielding properties of the absorbing layer, and also degrades transfer contrast and accuracy in the transferred pattern. In other words, when the absorbing layer is too thin, the contrast necessary to keep the accuracy in the transferred pattern will no longer be obtained. In other words, an absorbing layer, which is excessively thick or thin, can cause problems. Therefore, the thickness of the absorbing layer recently is in a range of about 50 to 90 nm, with the reflectance of extreme ultraviolet rays (EUV rays) of the absorbing layer being in a range of about 0.5 to 2%.

(Multiple Exposure of Adjacent Chips)

On the other hand, in transferring a circuit pattern onto a semiconductor substrate using a reflective mask, a plurality of chips of the circuit pattern are formed on a single semiconductor substrate. Between adjacent chips, there may be a region where the outer peripheral portions of the chips overlap with each other. This is caused by high-density arrangement of the chips, which is based on an idea of producing as many chips as possible per wafer to improve productivity. In this case, the overlapped region will be exposed for a plurality of times, four times at maximum (multiple exposure). The outer peripheral portion of each chip of the transferred pattern is also an outer peripheral portion on the mask, which is usually included in the absorbing layer. However, as described above, since the reflectance of EUV light of the absorbing layer is in a range of about 0.5 to 2%, the outer peripheral portion of each chip is problematically multiply exposed. Therefore, it is necessity to provide a region in the outer peripheral portion of each chip on the mask where the effect of shielding EUV light is higher than in a commonly used absorbing layer (hereinafter the region is referred to as a light shielding frame).

In order to improve or even solve such problems, there is proposed a reflective mask in which a groove is formed through the absorbing layer and the multi-layer reflective layer of a reflective mask to thereby lower the reflectance of the multi-layer reflective layer and to provide a light shielding frame having high light shielding properties against the wavelength of an exposure light source (e.g. see JP-A-2009-212220).

However, the EUV light source, which has a peak of its radiation spectrum at a wavelength of 13.5 nm, is known to also radiate light ranging from vacuum ultraviolet outside a waveband of 13.5 nm, which is called out-of-band light, to the near infrared-range light at a wavelength of 140 to 400 nm. In the light shielding frame proposed in JP-A-2009-212220, the out-of-band light is transmitted, as shown in FIG. 12, through the substrate, and reflected off a rear-face conductive film made such as of chromium nitride (CrN) and formed on the EUV mask on a side opposite to a pattern side. Then, the out-of-band light is again transmitted through the substrate for radiation toward a semiconductor substrate to problematically expose the resist coated on the semiconductor substrate.

SUMMARY OF THE INVENTION

The present disclosure has been made in light of the problems set forth above and has as its object to provide a reflective mask that reduces reflection of out-of-band light in a mask region corresponding to each chip's boundary region multiply exposed in a semiconductor substrate.

The present disclosure has been made in light of the above problems. A first aspect of the present disclosure is a reflective mask blank including: a substrate; a multi-layer reflective layer formed on a surface of the substrate; a protective layer formed on the multi-layer reflective layer; and an absorbing layer formed on the protective layer. In the reflective mask blank, the absorbing layer includes a circuit pattern region with an outer side thereof at least partially including a light shielding frame where the absorbing layer, the protective layer, and the multi-layer reflective layer have been removed and reflectance of EUV light and out-of-band light is low. In the reflective mask blank, the substrate of the light shielding frame includes a region where refractive index has been changed.

A second aspect of the present disclosure is the reflective mask blank according to the first aspect, in which the region where refractive index has been changed includes a region where pores are formed to change the refractive index.

A third aspect of the present disclosure is the reflective mask blank according to the first aspect, in which the region where refractive index has been changed includes a region where density is increased to change the refractive index.

A fourth aspect of the present disclosure is the reflective mask blank according to the first aspect, in which the region where refractive index has been changed includes a region where the refractive index has a gradient.

A fifth aspect of the present disclosure is a method for manufacturing a reflective mask blank including steps of: irradiating a laser to a substrate; and forming inside a substrate or near a surface of the substrate at least any of a region where pores are formed, a region where the refractive index has been changed by increasing density, or a region where the refractive index has a gradient.

A sixth aspect of the present disclosure is the method for manufacturing a reflective mask blank according to the fifth aspect, in which the laser to be irradiated is any of a femtosecond laser, an attosecond laser, a zeptosecond laser, or a yoctosecond laser.

A seventh aspect of the present disclosure is a reflective mask obtained by patterning the absorbing layer of the reflective mask blank according to any of the first to fourth aspects.

The reflective mask includes a light shielding frame formed in a mask region corresponding to a boundary region of a chip on a semiconductor substrate multiply exposed. The substrate of the light shielding frame includes a region where the refractive index has been changed by increasing density, or a region where pores have been formed, or a region where the refractive index has a gradient. With this configuration, the light path of the incident out-of-band light and the light path of the out-of-band light reflected off the conductive film can be changed. Thus, there is provided a reflective mask which is able to reduce the out-of-band light reflected off the conductive film.

With the use of the reflective mask of this configuration, influence on the wiring pattern dimension of the semiconductor or the like can be further reduced. Thus, the productivity of the semiconductor or the like can be improved.

BRIEF DESCRIPTION OF THE DRAWINGS

In the accompanying drawings.

DESCRIPTION OF REPRESENTATIVE EMBODIMENTS (Configurations of Reflective Mask and Reflective Mask Blank of the Present Disclosure)

With reference to the accompanying drawings, hereinafter will be described some embodiments of the present disclosure.

Figure 1A:
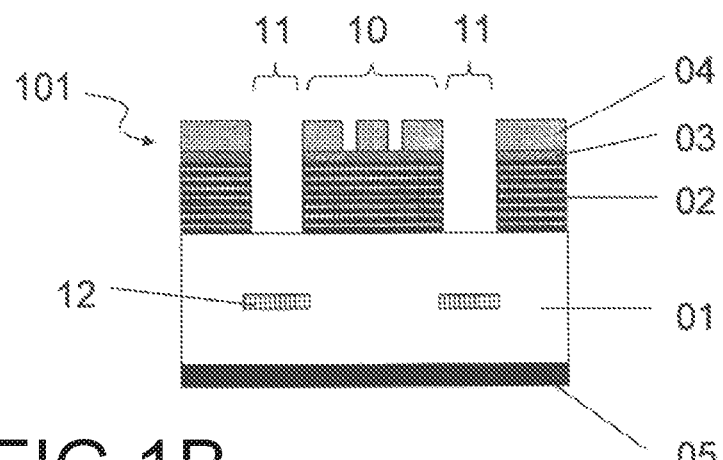
FIGS. 1A and 1B are schematic cross sectional views each illustrating a structure of a reflective mask according to the present disclosure.
Figure 1B:
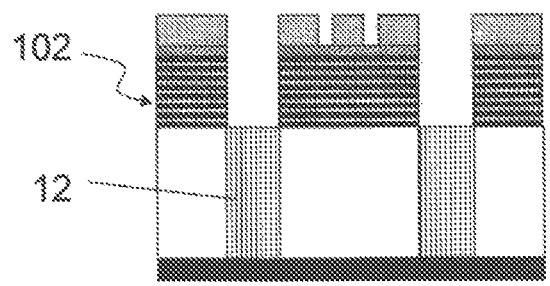
Figure 1C:
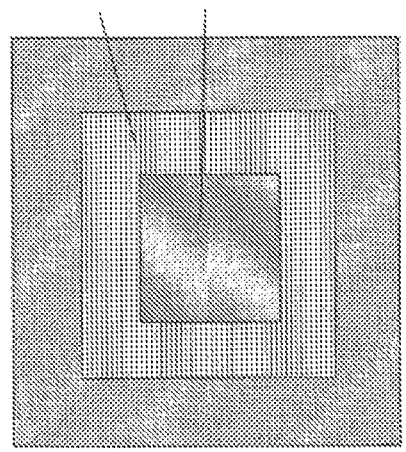
FIG. 1C is a schematic plan view illustrating the structure of the reflective mask illustrated in FIG. 1A or 1B.

First, a configuration of a reflective mask of the present disclosure will be described. FIGS. 1A and 1B are schematic cross sectional views illustrating structures of reflective masks 101 and 102, respectively, of the present disclosure. FIG. 1C is a schematic plan view illustrating the reflective mask 101 or 102 illustrated in FIG. 1A or 1B as viewed from above.

In each reflective mask according to the present embodiment, a circuit pattern is formed on an absorbing layer. In the present embodiment, a reflective mask blank is defined to be a flat mask before formation of a circuit pattern in an absorbing layer. In the following description, when a reflective mask blank is referred to, it means a mask with a flat absorbing layer before a circuit pattern is formed.

The reflective masks, or reflective mask blanks, 101 and 102 illustrated in FIGS. 1A and 1B each include a multi-layer reflective layer 2, a protective layer 3, and an absorbing layer 4 formed in this order on a surface of a substrate 1. The substrate 1 has a rear face on which a conductive film 5 is formed. A buffer layer may be provided between the protective layer 3 and the absorbing layer 4. The buffer layer is provided to prevent the protective layer 3, as an underlayer, from being damaged when the mask pattern of the absorbing layer 4 is corrected.

The reflective masks, or reflective mask blanks, 101 and 102 of the present disclosure each include a pattern region 10 where the absorbing layer 4 will be processed (in the case of a reflective mask blank) or has been processed (in the case of a reflective mask), a light shielding frame 11 formed in an outer peripheral portion of the pattern region 10, and a region 12 inside the substrate 1. The light shielding frame 11 is formed by removing the absorbing layer 4, the protective layer 3, and the multi-layer reflective layer 2, as well as the buffer layer, if provided. In the region 12, the refractive index has been changed by laser irradiation.

Figure 2:
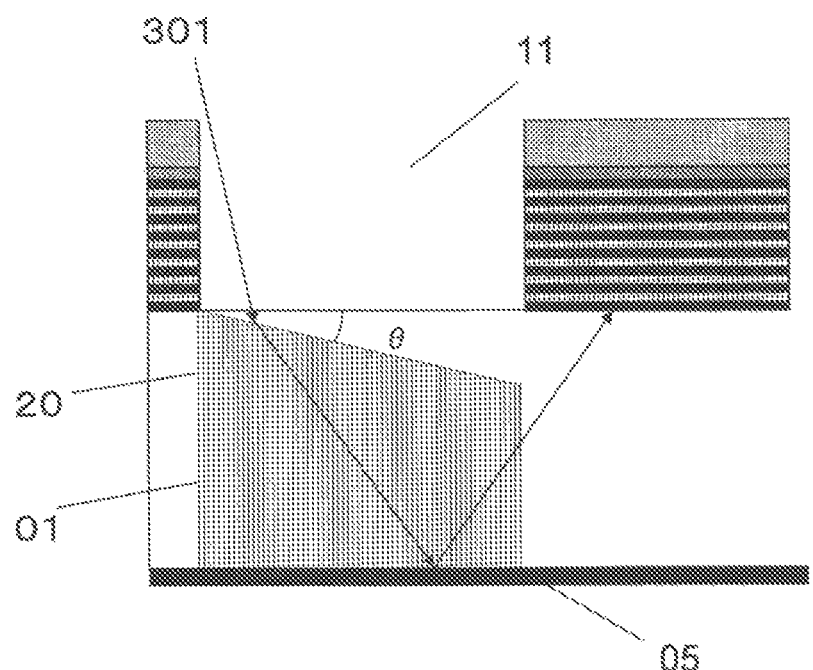
FIG. 2 is a schematic side view illustrating a mask reducing out-of-band light by refraction in a region where the refractive index has been changed, according to the present disclosure.

FIG. 2 is a schematic side view illustrating a mask reducing out-of-band light by refraction in the region where the refractive index has been changed, according to the present disclosure. A laser is irradiated to the inside of the substrate 1 to form a region 20 where the refractive index is small to thereby reduce out-of-band light. The mechanism for reducing out-of-band light is that, when out-of-band light 301 is incident on the region 20 having a small refractive index, the direction of the light is changed by refraction, and the out-of-band light is prevented from being transferred toward the semiconductor substrate if the out-of-band light is reflected off the rear-face conductive film. The region having a small refractive index can be provided by forming pores, for example. The refractive index of the substrate is about 1.5 and the refractive index of the pores is about 1. Taking account of this, in order to prevent the out-of-band light from being transferred toward the semiconductor substrate if the out-of-band light is reflected off the rear-face conductive film, the region 20 has to be formed being inclined. Since the out-of-band light 301 is incident at an angle of 6°, the region 20 is required to have an inclination of at least θ=25° or greater. Further, the region 20 is required to be aligned with the light shielding frame and have a width equal to that of the light shielding frame. Forming the region 20 in this way, the direction of light is changed by refraction. As a result, the out-of-band light reflected off the rear-face conductive film can be prevented from passing through the light shielding frame 11 and being transferred to the semiconductor substrate.

Figure 3:
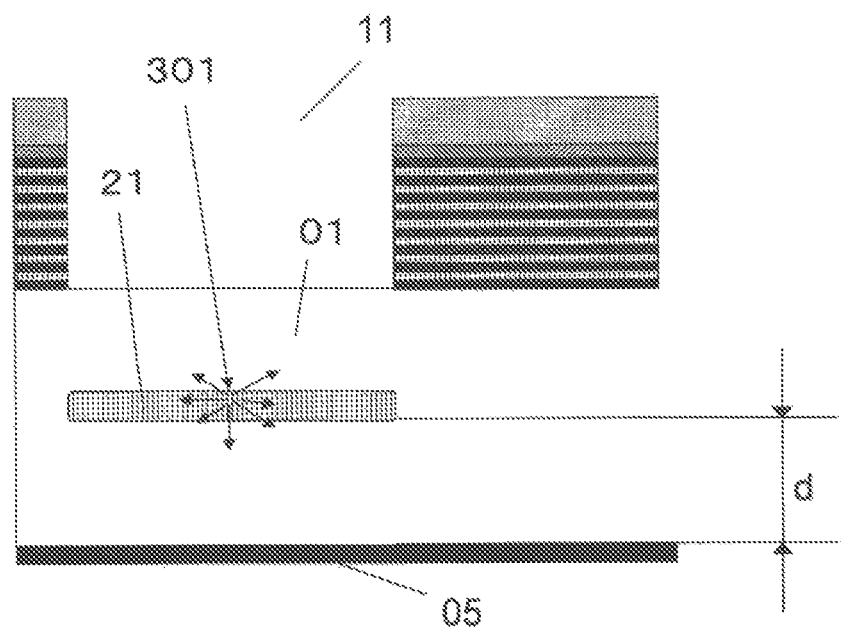
FIG. 3 is a schematic side view illustrating a mask reducing out-of-band light by scattering of light in a region where the refractive index has been changed, according to the present disclosure.

FIG. 3 is a schematic side view illustrating a mask reducing out-of-band light using scattering of light in a region where the refractive index has been changed, according to the present disclosure. Forming a region 21 where the refractive index has been changed by irradiating with a laser, out-of-band light can be reduced. The mechanism is that the out-of-band light 301, when being incident on the region 21, is scattered due to the changed refractive index to thereby reduce the out-of-band light reflected off the rear-face conductive film. The region 21 having a changed refractive index can be formed by forming pores in the substrate or increasing density of the substrate. The region 21 is aligned with the light shielding frame and is permitted to have a width equal to that of the light shielding frame. Taking account of the ease of laser irradiation from the rear face, the region 21 is preferably arranged near the center of the substrate in a thickness direction, i.e. at a distance d (=3 mm) from the rear face as shown in FIG. 3. Forming the region 21 to scatter light in this way, the out-of-band light reflected off the rear-face conductive film can be reduced. If a part of the scattered out-of-band light is vertically incident and reflected off the rear face conductive film, the light is scattered by the region 21. As a result, the out-of-band light passing through the light shielding frame 11 can be reduced to almost zero.

Figure 4:
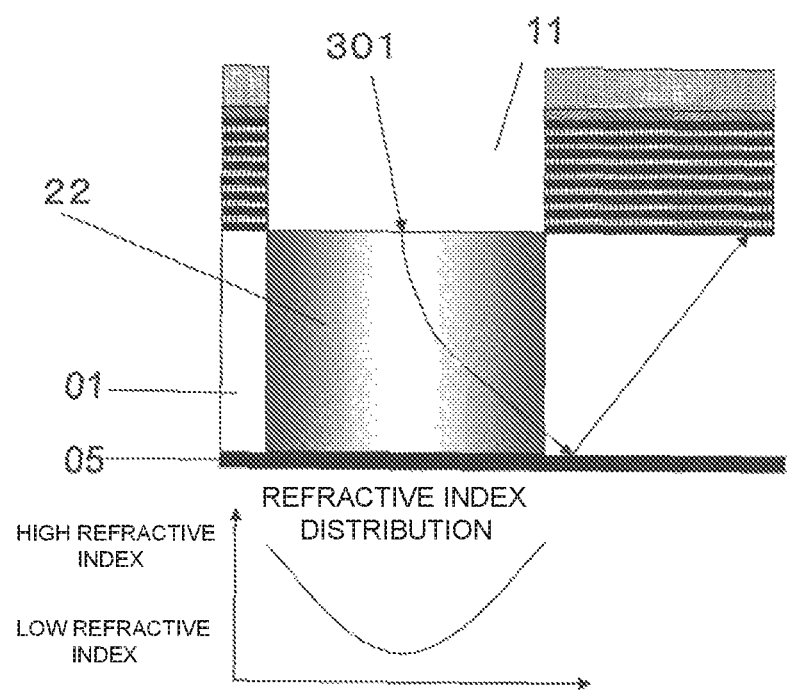
FIG. 4 is a set of diagrams one being a schematic side view illustrating a mask reducing out-of-band light by a region where the refractive index has a gradient, and the other being a diagram of the refractive index distribution of the region where the refractive index has a gradient, according the present disclosure.

FIG. 4 is a schematic side view illustrating a mask reducing the out-of-band light by a region having a refractive index gradient, according to the present disclosure. A laser is irradiated into the substrate to form a region 22 having a refractive index gradient as shown in a graph of FIG. 4 to thereby reduce the out-of-band light. The mechanism is that the incident out-of-band light 301, when transmitting through the region having a refractive index gradient, is deflected to a higher refractive index portion, and the out-of-band light is not transferred toward the semiconductor substrate if the out-of-band light is reflected off the rear-face conductive film. The region having a refractive index gradient can be formed by changing the density of the substrate by laser irradiation. When the difference in gradient of the refractive index is about 0.02 (refractive index difference/mm) or greater, the out-of-band light incident on the center of the light shielding frame 11 can be deflected to a region having no influence on the transfer toward the semiconductor substrate. The region 22 is required to be aligned with the light shielding frame, while being extended from the front face to rear face, or throughout the depth, of the substrate 1, and to have a width equal to that of the light shielding frame. Forming the region 22 in such a way of deflecting light, the out-of-band light reflected off the rear-face conductive film can be reduced.

(Configuration of Reflective Mask of the Present Disclosure: Multi-layer reflective layer, Protective Layer, and Buffer Layer)

The multi-layer reflective layer 2 of FIG. 1A is designed to achieve a reflectance of about 60% for EUV light. The multi-layer reflective layer 2 is a laminated film in which 40 to 50 pairs of Mo layers and Si layers are alternately laminated. The protective layer 3, which is the topmost layer, is formed of a ruthenium (Ru) layer with a thickness of 2 to 3 nm or a silicon (Si) layer with a thickness of about 10 nm. The layer adjacently located below the Ru layer is a Si layer. Since Mo and Si absorb less EUV light (have low extinction coefficient) and have a large refractive index difference for EUV light, reflectance can be increased in the interface between the Si layer and the Mo layer. This is the reason why Si and Mo are used for the multi-layer reflective layer 2. The protective layer 3, when made of Ru, can serve as a stopper in processing the absorbing layer 4 or as a protective layer against a chemical solution in cleaning the mask. When the protective layer 3 is made of Si, a buffer layer may be arranged between the protective layer 3 and the absorbing layer 4. The buffer layer is provided to protect the Si layer in etching the absorbing layer 4 or in correcting the pattern. The Si layer is the topmost layer of the multi-layer reflective layer 2 and provided adjacently below the buffer layer. The buffer layer is made of chromium (Cr) or a nitrogen compound thereof (CrN).

(Configuration of Reflective Mask of the Present Disclosure: Absorbing Layer)

The absorbing layer 4 shown in FIG. 1A is made of a nitrogen compound (TaN) of tantalum (Ta) having a high EUV absorptivity. As other materials, the absorbing layer 4 may be made of tantalum boron nitride (TaBN), tantalum silicon (TaSi), tantalum (Ta), or oxides of these materials (TaBON, TaSiO, and TaO). The absorbing layer 4 shown in FIG. 1A may have a two-layer structure including an upper layer as a low reflective layer which is antireflective to UV light having a wavelength of 190 to 260 nm. The low reflective layer is provided to enhance contrast to the inspection wavelength of a mask defect inspection device and to improve inspectability.

(Configuration of Reflective Mask of the Present Disclosure: Rear-Face Conductive Film)

The conductive film 5 shown in FIG. 1A is made of CrN in general. Since the conductive film 5 only has to be electrically conductive, any material containing a metallic material can be used. Although FIG. 1A shows a configuration including the conductive film 5, the mask blank, or the mask, may be configured without including the conductive film 5.

(Method for Manufacturing Reflective Mask of the Present Disclosure)

Figure 8A:
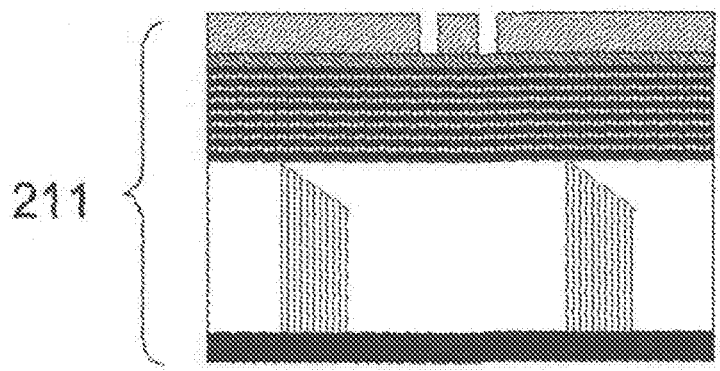
FIGS. 8A to 8C are schematic cross sectional views each illustrating a part of a process of fabricating a reflective mask (formation of a light shielding frame), according to an example of the present disclosure.

A method for forming the light shielding frame of the reflective mask of the present disclosure will be described in detail. First, a reflective mask 211 shown in FIG. 8A is subjected to photolithography or electron-beam lithography to form a resist pattern with only a light shielding frame portion being opened. Subsequently, the absorbing layer 4 and the protective layer 3 in the opening of the resist pattern are removed by dry etching using a fluorine-based gas or chlorine-based gas, or both. Subsequently, the multi-layer reflective layer 2 in the opening is penetrated and removed by dry etching using a fluorine-based gas or chlorine-based gas, or both, or by wet etching using an alkaline solution or an acid solution.

The reason why a fluorine-based gas or chlorine-based gas, or both are used in penetrating and removing the multi-layer reflective layer 2 by dry etching is that these gases have etchability to Mo and Si which are the materials of the multi-layer reflective layer. Fluorine-based gases that can be used for etching include $CF_4$, $C_2F_6$, $C_4F_8$, $C_5F_8$, $CHF_3$, $SF_6$, $ClF_3$, $Cl_2$, and HCl.

In penetrating and removing the multi-layer reflective layer 2 by wet etching, the etchant to be used is required to be suitable for etching Mo and Si which are the materials of the multi-layer reflective layer 2. For example, as an alkaline solution, a solution of tetramethyl ammonium hydroxide, (TMAH), potassium hydroxide (KOH), or ethylene diamine pyrocatechol (EDP) is appropriately used. As an acid solution, a liquid mixture of nitric acid and phosphoric acid is appropriately used. Hydrogen fluoride, sulfuric acid, or acetic acid may be added to the liquid mixture.

As described above, a reflective mask that reduces the reflection of out-of-band light can be obtained as an EUV mask having a light shielding region from which the multi-layer reflective layer has been removed.

Examples

Figure 5A:
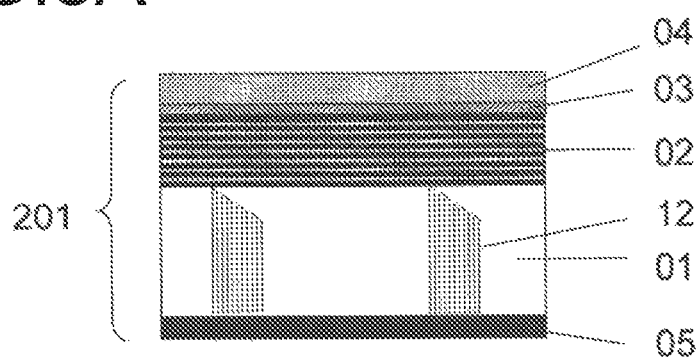
FIGS. 5A to 5C are schematic cross sectional views each illustrating a part of a process of fabricating a reflective mask (up to formation of a pattern), according to an example of the present disclosure.

The following description sets forth an example of a method for manufacturing the reflective mask according to the present disclosure. A reflective mask blank 201 shown in FIG. 5A was used in the present example. The mask blank 201 includes a substrate 1, a multi-layer reflective layer 2, a protective layer 3 and an absorbing layer 4, which are laminated in this order from bottom to top. The multi-layer reflective layer 2 includes 40 pairs of Mo layers and Si layers designed to have a reflectance of about 64% relative to EUV light having a wavelength of 13.5 nm. The protective layer 3 is made of Ru and has a thickness of 2.5 nm. The absorbing layer 4 is made of TaSi and has a thickness of 70 nm.

In the mask blank, before forming the rear-face conductive film 5, a laser is irradiated to the substrate 1 to form pores to thereby provide a region 12 where the refractive index has been changed. The region 12 is at a position spaced apart by 3 µm from a 10 cm×10 cm main pattern region at the center of the mask where the light shielding frame of the mask of the present disclosure is to be formed. In addition, the region 12 is located so as to be aligned with the region serving as the light shielding frame and has a width of 5 mm equal to that of an opening of the region serving as the light shielding frame.

The pores were formed using a femtosecond laser device under the conditions of 800 nm wavelength, 120 fs pulse width, and 200 kHz frequency.

Figure 5B:
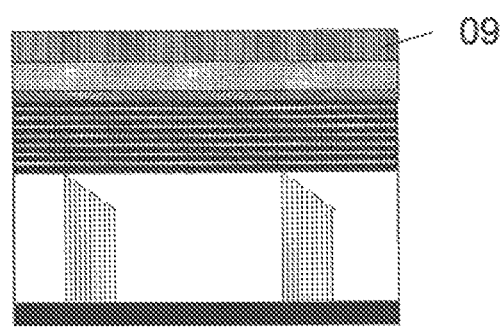
Figure 5C:
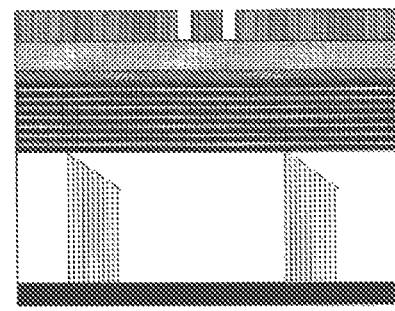

Then, a chemically amplified positive resist 9 (FEP171 manufactured by FUJIFILM Electronic Materials Co., Ltd.) was coated onto the mask blank so as to have a thickness of 300 nm (FIG. 5B), followed by producing a pattern using an electron beam lithography exposure system (JBX9000 manufactured by JEOL Ltd.). The resultant mask blank was subjected to post exposure baking (PEB) at a temperature of 110° C. for 10 minutes and spray development (SFG3000 manufactured by Sigmameltec LTD.), thereby forming a resist pattern on the resist (FIG. 5C).

Figure 6A:
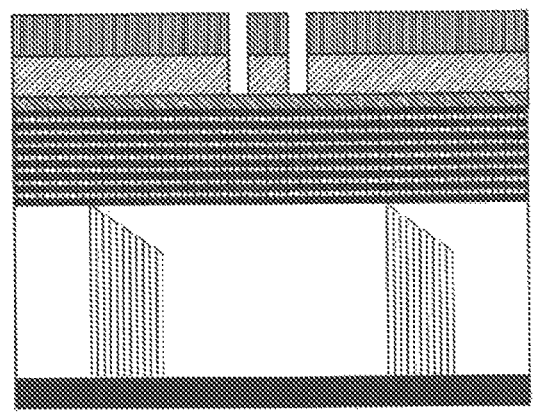
FIGS. 6A and 6B are schematic cross sectional views each illustrating the rest of the process of fabricating the reflective mask (up to formation of the pattern)
Figure 6B:
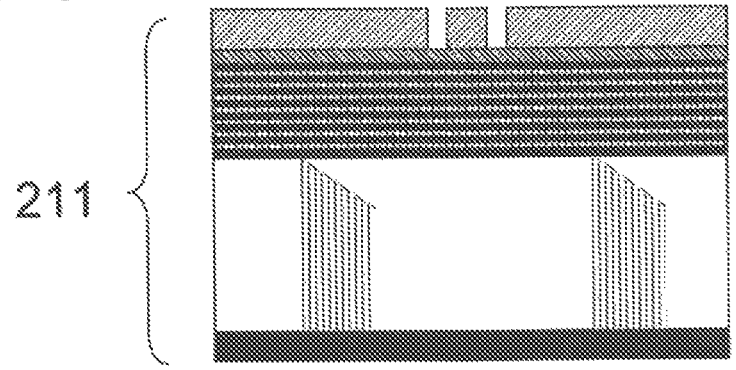
Figure 7:
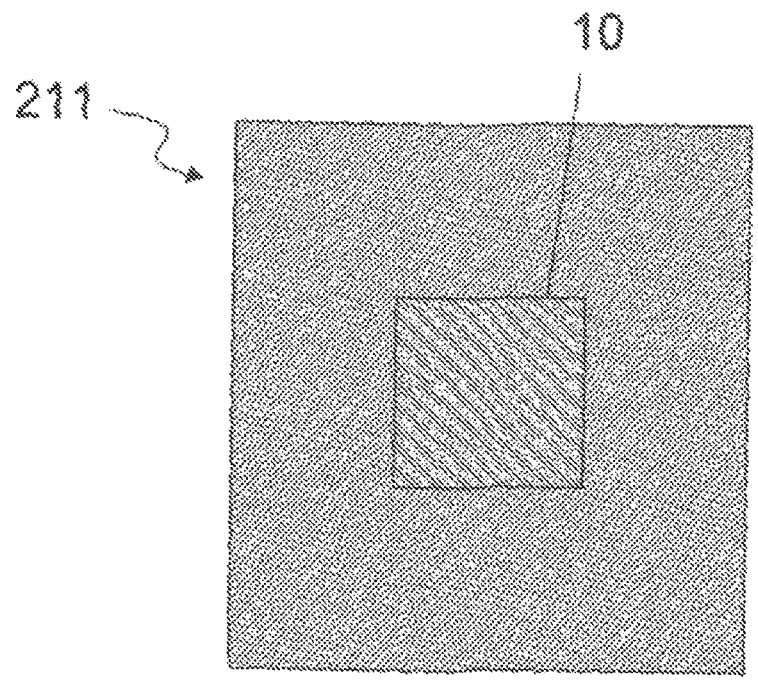
FIG. 7 is a schematic plan view illustrating a reflective mask according to an example of the present disclosure (up to formation of a pattern)

Subsequently, the absorbing layer 4 was etched with $CF_4$ plasma and $Cl_2$ plasma using a dry etching device (FIG. 6A), followed by separating the resist and cleaning. In this way, a reflective mask 211 having an evaluation pattern (pattern region 10) as shown in FIG. 6B was prepared. The evaluation pattern was made of lines and spaces provided at a ratio of 1:1 with a dimension of 200 nm, and arranged at the center of the mask. The size of the pattern region 10 was 10 cm×10 cm. FIG. 7 shows a schematic plan view of the reflective mask 211 with the pattern region 10.

Figure 8B:
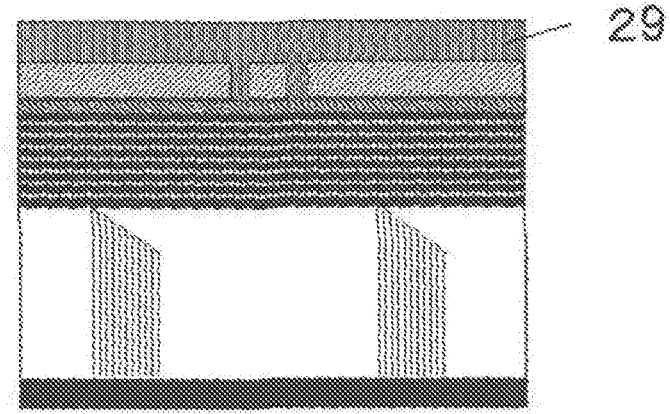
Figure 8C:
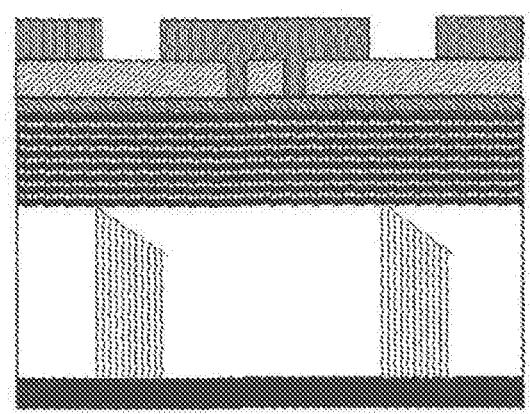

Subsequently, a light shielding frame was formed on the pattern region 10 of the reflective mask 211, the pattern region 10 being provided with the above evaluation pattern. Specifically, an i-line resist 29 was coated onto the reflective mask 211 (FIG. 8A) so as to have a thickness of 500 nm (FIG. 8B). Then, a pattern was drawn on the i-line resist 29 using an i-line lithography exposure system (ALTA), followed by development. Thus, a resist pattern was formed, in which the region serving as the light shielding frame later was open (FIG. 8C). The opening of the resist pattern had a width of 5 mm, and was located being spaced apart by 3 from the 10 cm×10 cm main pattern region at the mask center.

Figure 9A:
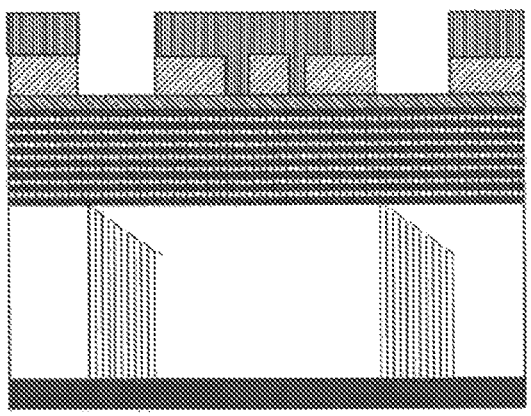
FIGS. 9A to 9C are schematic cross sectional views each illustrating the rest of the process of fabricating the reflective mask (formation of the light shielding frame)
Figure 9B:
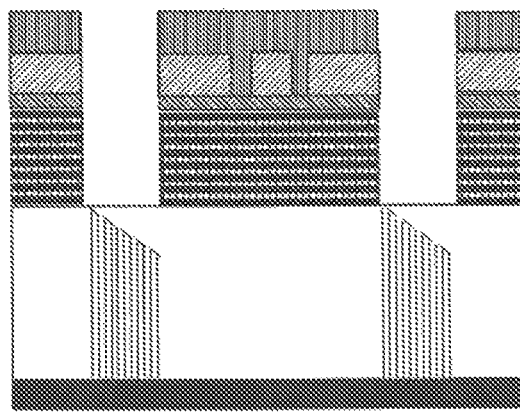

Subsequently, the absorbing layer 4 and the multi-layer reflective layer 2 in the opening of the resist were penetrated and removed by vertical dry etching with $CHF_3$ plasma using a dry etching device (FIGS. 9A and 9B). The dry etching was conducted under the conditions where the pressure in the dry etching device was 50 mTorr, inductively coupled plasma (ICP) power was 500 W, reactive ion etching (ME) power was 2000 W, a $CHF_3$ flow rate was 20 sccm, and treatment time was 6 minutes. As a result, a shape as shown in FIG. 9B was obtained.

Figure 9C:
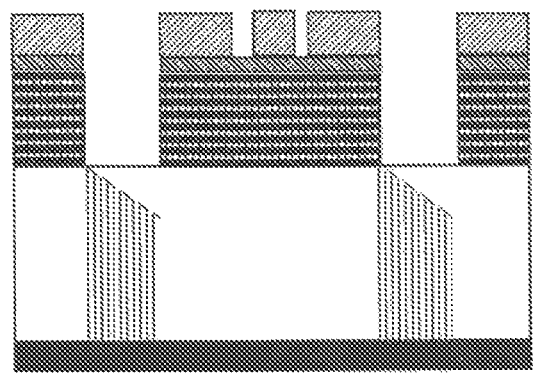
Figure 10:
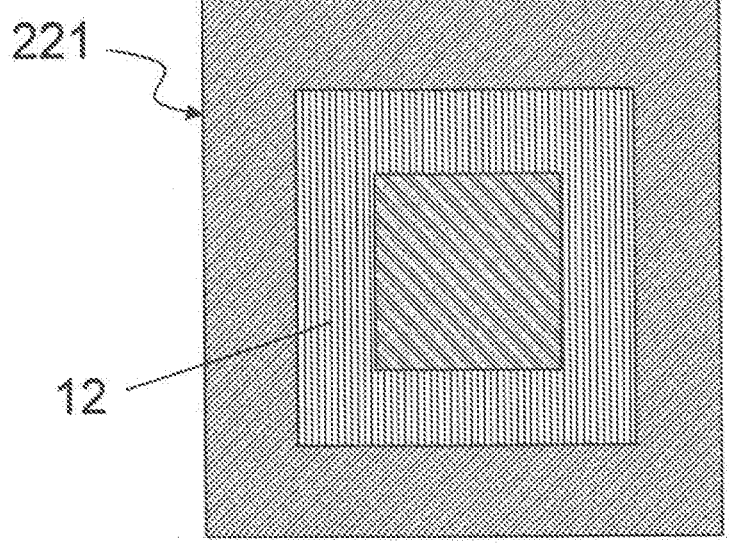
FIG. 10 is a schematic plan view illustrating a reflective mask according to an example of the present disclosure.

Finally, using a sulfuric acid-based remover and an ammonia hydrogen peroxide solution, the resist was separated, followed by cleaning, which was further followed by dry etching to remove the remaining resist (FIG. 9C). FIG. 10 shows a reflective mask 221 prepared in the present example.

Figure 11A:
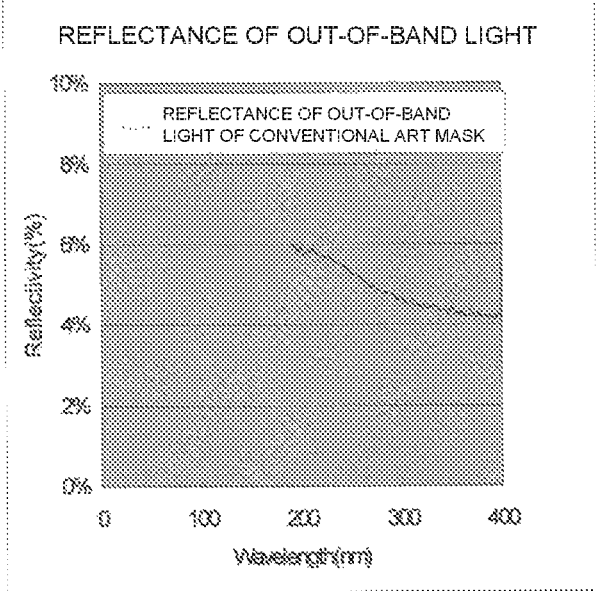
FIG. 11A is a graph illustrating reflectance of out-of-band light of a reflective mask according to an example of the present disclosure.
Figure 11B:
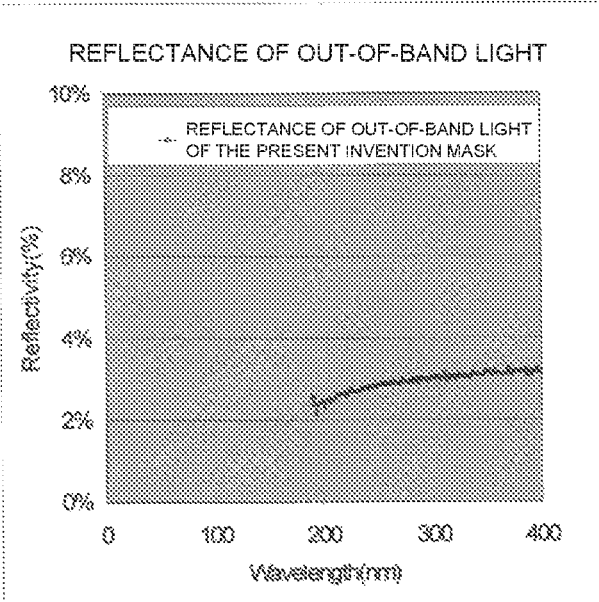
FIG. 11B is a graph illustrating reflectance of out-of-band light of a mask based on conventional art.
Figure 12:
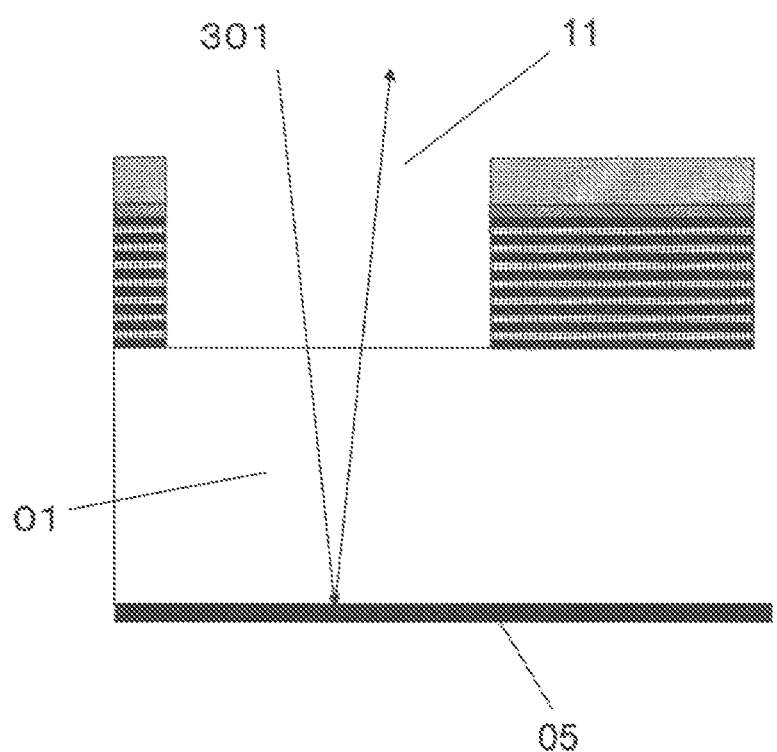
FIG. 12 is a schematic diagram illustrating reflection of out-of-band light in a mask based on conventional art.

Subsequently, reflectances of both the reflective mask according to the present disclosure and a conventional reflective mask with a light shielding frame were measured in the light shielding frame regions. As a result, it was confirmed that the reflectance of the reflective mask with the light shielding frame of the present disclosure could reduce reflectance, as shown in FIG. 11A, by about 40% at a wavelength in a range of 200 nm to 400 nm compared to the reflectance of the conventional reflective mask with the light shielding frame, as shown in FIG. 11B.

As described above, a reflective mask that reduced the reflection of out-of-band light could be prepared.

For example, the present disclosure is useful for reflective masks.

What is claimed is:

1. A reflective mask blank comprising:
    a substrate;
    a multi-layer reflective layer formed on a surface of the substrate;
    a protective layer formed on the multi-layer reflective layer; and
    an absorbing layer formed on the protective layer,
    wherein the absorbing layer includes a circuit pattern region with an outer side thereof at least partially including a light shielding frame where the absorbing layer, the protective layer, and the multi-layer reflective layer have been removed and reflectance of EUV light and out-of-band light is low; and
    wherein the substrate of the light shielding frame includes a region where a refractive index has been changed, the region being inside the substrate.

2. The reflective mask blank of claim 1, wherein the region where the refractive index has been changed includes a region where pores are formed to change the refractive index.

3. A reflective mask obtained by patterning the absorbing layer of the reflective mask blank of claim 2.

4. The reflective mask blank of claim 1, wherein the region where the refractive index has been changed includes a region where density is increased to change the refractive index.

5. A reflective mask obtained by patterning the absorbing layer of the reflective mask blank of claim 4.

6. The reflective mask blank of claim 1, wherein the region where the refractive index has been changed includes a region where the refractive index has a gradient.

7. A reflective mask obtained by patterning the absorbing layer of the reflective mask blank of claim 6.

8. A reflective mask obtained by patterning the absorbing layer of the reflective mask blank of claim 1.

9. A method for manufacturing a reflective mask blank comprising steps of:
    irradiating a substrate using a laser substrate; and
    forming, inside the substrate, at least a region where a refractive index has been changed by increasing density.

10. The method for manufacturing a reflective mask blank of claim 9, wherein the laser is a laser selected from the group consisting of a femtosecond laser, an attosecond laser, a zeptosecond laser, or a yoctosecond laser.

* * * * *